(12) United States Patent
Ahmadi et al.

(10) Patent No.: US 9,001,869 B2
(45) Date of Patent: Apr. 7, 2015

(54) COMPACT LOW-POWER FULLY DIGITAL CMOS CLOCK GENERATION APPARATUS FOR HIGH-SPEED SERDES

(71) Applicant: Broadcom Corporation, Irvine, CA (US)

(72) Inventors: Mahmoud Reza Ahmadi, Huntington Beach, CA (US); Siavash Fallahi, Newport Coast, CA (US); Tamer Ali, Irvine, CA (US); Ali Nazemi, Aliso Viejo, CA (US); Hassan Maarefi, San Jose, CA (US); Burak Catli, Costa Mesa, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 3 days.

(21) Appl. No.: 13/946,981

(22) Filed: Jul. 19, 2013

(65) Prior Publication Data

US 2014/0241442 A1 Aug. 28, 2014

Related U.S. Application Data

(60) Provisional application No. 61/825,488, filed on May 20, 2013, provisional application No. 61/770,990, filed on Feb. 28, 2013.

(51) Int. Cl.
*H04B 3/36* (2006.01)
*H03L 7/00* (2006.01)

(52) U.S. Cl.
CPC ........................................ *H03L 7/00* (2013.01)

(58) Field of Classification Search
USPC .................. 375/211, 220, 360, 373, 375, 376
See application file for complete search history.

(56) References Cited

U.S. PATENT DOCUMENTS

| | | | |
|---|---|---|---|
| 5,799,051 A * | 8/1998 | Leung et al. ................... | 375/376 |
| 7,915,941 B1 | 3/2011 | Pan et al. | |
| 8,004,328 B2 | 8/2011 | Kim et al. | |
| 2004/0170244 A1 * | 9/2004 | Cranford et al. ............... | 375/373 |

OTHER PUBLICATIONS

Chou, et al., "Phase Averaging and Interpolation Using Resistor Strings or Resistor Rings for Multi-Phase Clock Generation," IEEE Transactions on Circuits and Systems—I: Regular Papers, May 2006, vol. 53, No. 5, pp. 984-991.

* cited by examiner

*Primary Examiner* — Kabir A Timory
(74) *Attorney, Agent, or Firm* — McDermott Will & Emery LLP

(57) ABSTRACT

A device for high-speed clock generation may include an injection locking-ring oscillator (ILRO) configured to receive one or more input clock signals and to generate multiple clock signals with different equally spaced phase angles. A phase-interpolator (PI) circuit may be configured to receive the multiple coarse spaced clock signals and to generate an output clock signal having a correct phase angle. The PI circuit may include a smoothing block that may be configured to smooth the multiple clock signals with different phase angles and to generate multiple smooth clock signals. A pulling block may be configured to pull edges of the multiple smooth clock signals closer to one another.

20 Claims, 6 Drawing Sheets

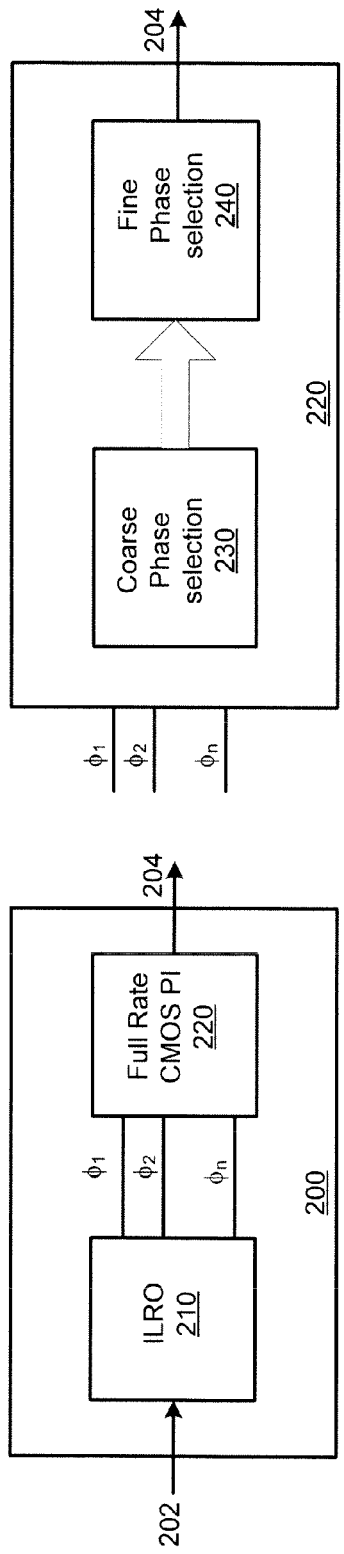
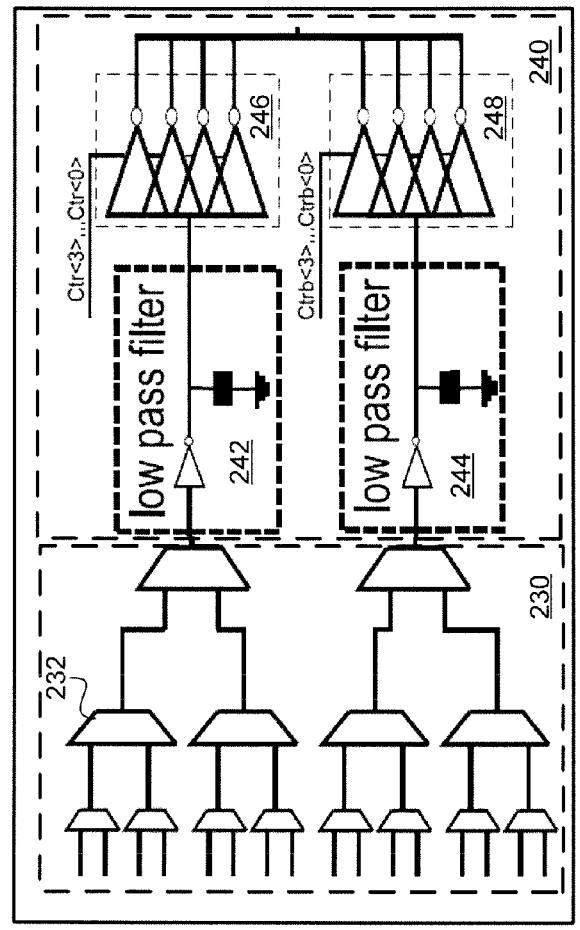
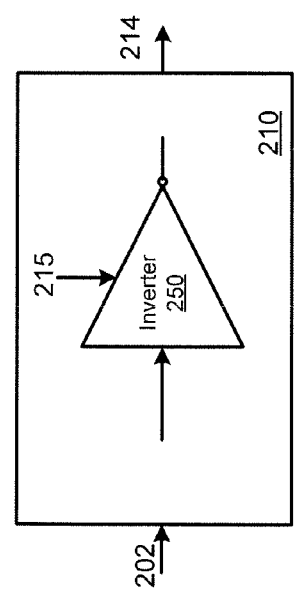
FIG. 2C
FIG. 2D
FIG. 2A
FIG. 2B

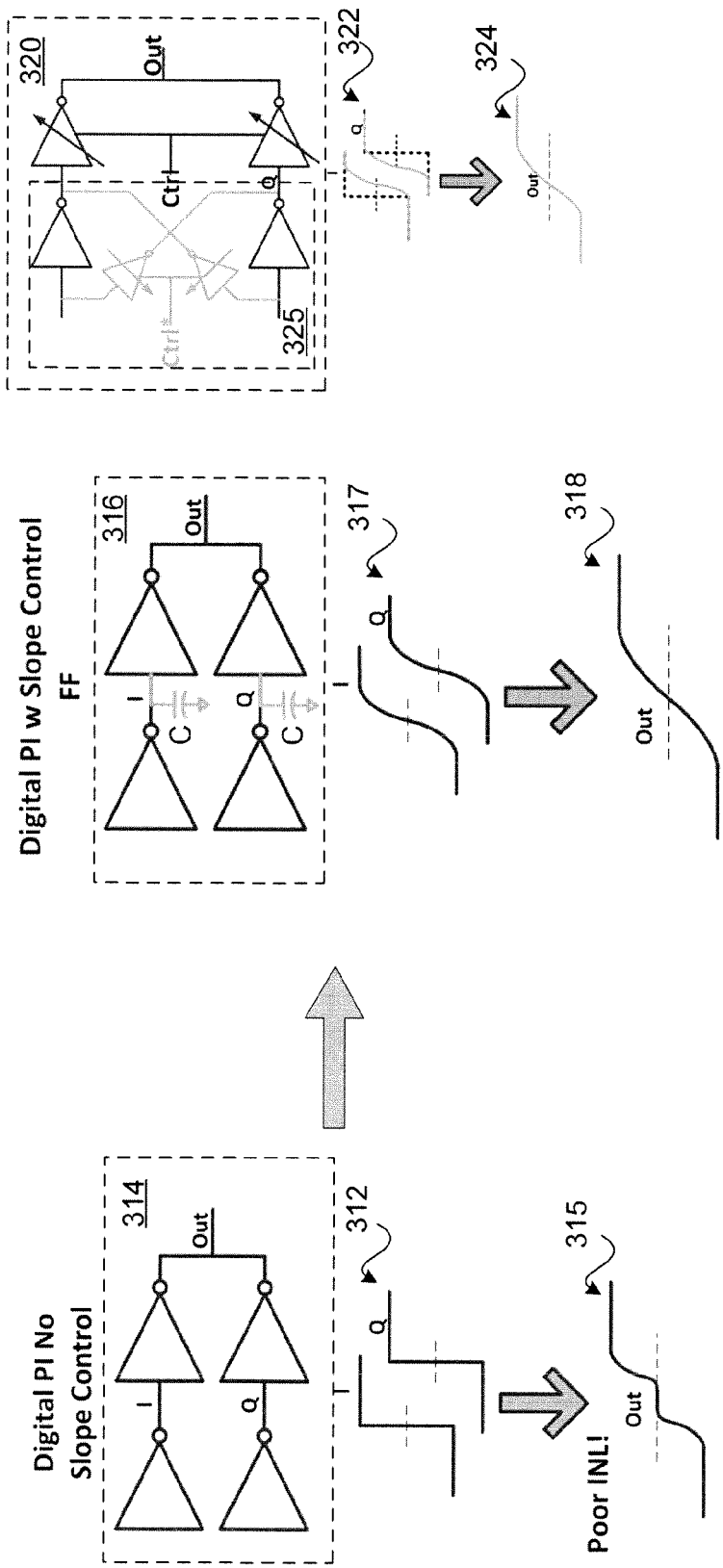

COMPACT LOW-POWER FULLY DIGITAL CMOS CLOCK GENERATION APPARATUS FOR HIGH-SPEED SERDES

CROSS-REFERENCE TO RELATED APPLICATIONS

This application claims the benefit of priority under 35 U.S.C. §119 from U.S. Provisional Patent Application 61/770,990 filed Feb. 28, 2013 and from U.S. Provisional Patent Application 61/825,488 filed May 20, 2013, both of which are incorporated herein by reference in their entirety.

TECHNICAL FIELD

The present description relates generally to clock generation, and more particularly, but not exclusively, to a compact low-power fully digital complementary metal-oxide semiconductor (CMOS) clock generation apparatus for high-speed serializer-deserializer (SerDes).

BACKGROUND

High-speed serializer-deserializer (SerDes) circuits may use phase interpolator (PI) based clock and data recovery circuits (CDR) for optimum recovered clock positioning at receivers. These SerDes circuits may need a robust I/Q generation with minimal mismatch and a high performance phase interpolator circuit. I/Q generation, however, may have limited design choices. For example, I/Q generation by full-rate clock and subsequently dividing by 2 (e.g., half rate architecture) may face increased sensitivity to duty cycle error, whereas running the phased-lock loop (PLL) at twice the frequency for full-rate architecture and using divide-by-2 may be quite a challenge for transceivers targeting low power and running at data rates higher than 10 Gb/s.

Quadrature VCO based full-rate I/Q clock generation may suffer from large area and worse phase noise versus power consumption, and a high performance delay locked loop (DLL) may involve large area and more complexity. Phase interpolator circuits may include current-mode logic (CML) based PIs, which may be power hungry and may occupy a large area, thus cannot be scaled with digital CMOS technologies.

BRIEF DESCRIPTION OF THE DRAWINGS

Certain features of the subject technology are set forth in the appended claims. However, for purpose of explanation, several embodiments of the subject technology are set forth in the following figures.

FIGS. 2A-2E illustrate an example of a device for high-speed clock generation and details of the corresponding blocks of the device, in accordance with one or more implementations.

FIGS. 3A-3C illustrate examples of a smoothing block and a pulling block of a phase interpolator, in accordance with one or more implementations.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

The subject technology is directed to a digital scalable CMOS multi-rate clock generation architecture with full-rate coarse phase generation. The subject technology includes a number of advantageous features that can substantially surpass the existing solutions in terms of performance, cost, speed, and power scalability. For example, Advantages of the subject technology over the existing solutions may be categorized into architecture and circuit advantages, system advantages, and product advantages. The architecture advantages may include, but are not limited to, smaller area as compared to current mode logic (CML) phase interpolators (PIs) (e.g., at least 75% smaller); minimum additional area for high performance coarse phase generation using wide-band injection locked ring oscillator (ILRO); power scalability with decreasing frequency with same/better performance; and digital CMOS implementation that allows scaling with technology nodes.

The system advantages may include, but are not limited to, much smaller receiver implementation by reducing significant CML PI area and clock generation by using ILRO; wide frequency range of operation, which is desired for multi-standard PHYs; wide supply range of operation (e.g., 0.8V to 1.05V); and less sensitivity to process variation. The product advantages may include, but are not limited to, cost saving by reducing silicon area; and easy portability in fast-paced technology advancement due to standard CMOS nature of implementation.

Figures 1A, 1B:
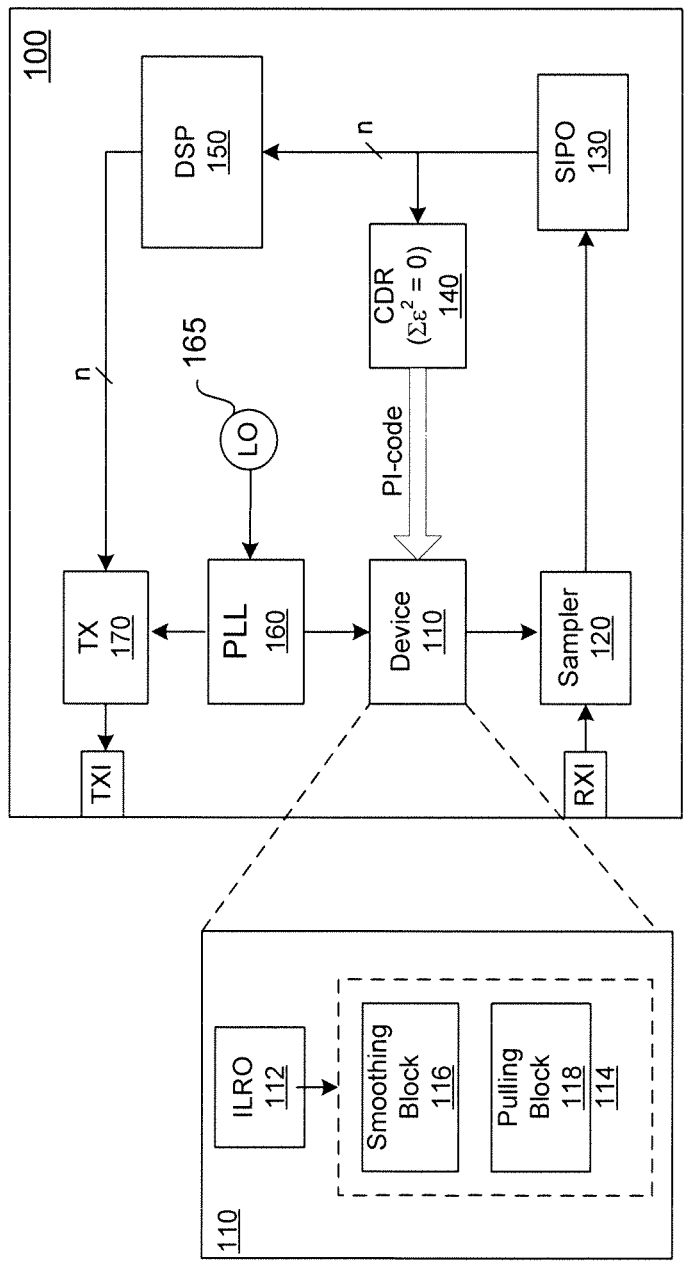
FIGS. 1A-1B illustrate an example of a high-speed digital communication system, for communication between two endpoints, including a device for high-speed clock generation, in accordance with one or more implementations.

FIGS. 1A-1B illustrate an example of a high-speed digital communication system 100, for communication between two endpoints, including a device 110 for high-speed clock generation, in accordance with one or more implementations of the subject technology. The device of the subject technology (e.g., device 110) may be an integral part of the digital communication system 100 that can communicate high-speed data over a communication channel (e.g., a wired channel). The digital communication system 100 may receive (and transmit) serial data and convert the serial data to parallel data for processing in a digital signal processor, while correcting the position of the clock signal for proper data sampling by a sampler using the PI of the subject technology.

The digital system 100 may be considered the first endpoint that includes a receive interface RXI, a sampler 120, a serial input parallel output (SIPO) module 130, a clock and data recovery (CDR) module 140, the device 110, a digital signal processor (DSP) 150, a phase-locked loop (PLL) 160, a local oscillator (LO) 165, a transmit (TX) block 170 and a transmit interface TXI. The sampler 120 may receive data from the receive interface RXI and sample the received data based on a corrected phase received from the device 110 and provide digital data to the SIPO module 130. The output of the SIPO module 130 is a digital number with n (e.g., 16 or more) words, which is processed in the DSP 150 and delivered to the TX block 170 for transmission to a second endpoint via the transmit interface TXI.

The PLL 160 may receive clock pulses from the LO 165 (e.g., a crystal oscillator) and may generate clock signals for the device 110 and the TX block 170. The device 110 may use PI-codes generated by the CDR module 140 and the clock signals from the PLL 160 to generate phase corrected clock signals for the sampler 120, where the phase corrected clock signals may include corrected phase angles (e.g., programmable phase angles). The phase-corrected clock signal may be achieved after many cycles (e.g., hundreds). In each cycle, the CDR module 140 may generate a PI-code (e.g., an error signal) that can help the device 100 to improve the sampling bit error rate (BER), and finally generate the phase-corrected clock signal. The timing of the phase-corrected clock signal may be such that a rising (or falling) edge of the clock signal occurs in the middle of each data signal, so that the sampling error of the sampler 120 is minimized.

A high-level block diagram of the device 110 is shown in FIG. 1B. The device 110 may include an ILRO 112 and a PI 114, including a smoothing block 116 and a pulling block 118. In one or more implementations, a number of ILROs may be cascaded if improved linearity is desired. The device 110 may use the ILRO block 112 to generate coarse multi-phase clock signals, which are smoothed by the smoothing block 116 and their edges are pulled closer to one another in the pulling block 118, before being processed by nonlinear weighting for linearity improvement.

The ILRO 112 may include a compact and low power wide-band ILRO that may be configured to receive the one or more input clock signals from the PLL 160 and generate multiphase (e.g., four in-phase (I) and quadrature-phase (Q)) clock signals at a full rate. In one or more aspects, the ILRO 112 can be configured to generate 16-phase clock signals at the full rate or at a reduced rate that is approximately one-fourth of the full rate.

In one or more implementations of the subject technology, the PI 114 may include a digital PI having the smoothing block 116 and the pulling block 118 as two viable options for filtering. The smoothing block 116 may include a slope controlled flip-flop that can filter the harmonics of the multi-phase clock signals. The pulling block 118 may include tri-state crossed-coupled inverters, which may be configured to smooth the multi-phase clock signals and improve linearity by pulling edges of the plurality of smooth clock signals closer to one another, as described in greater detail herein.

Figure 2E:
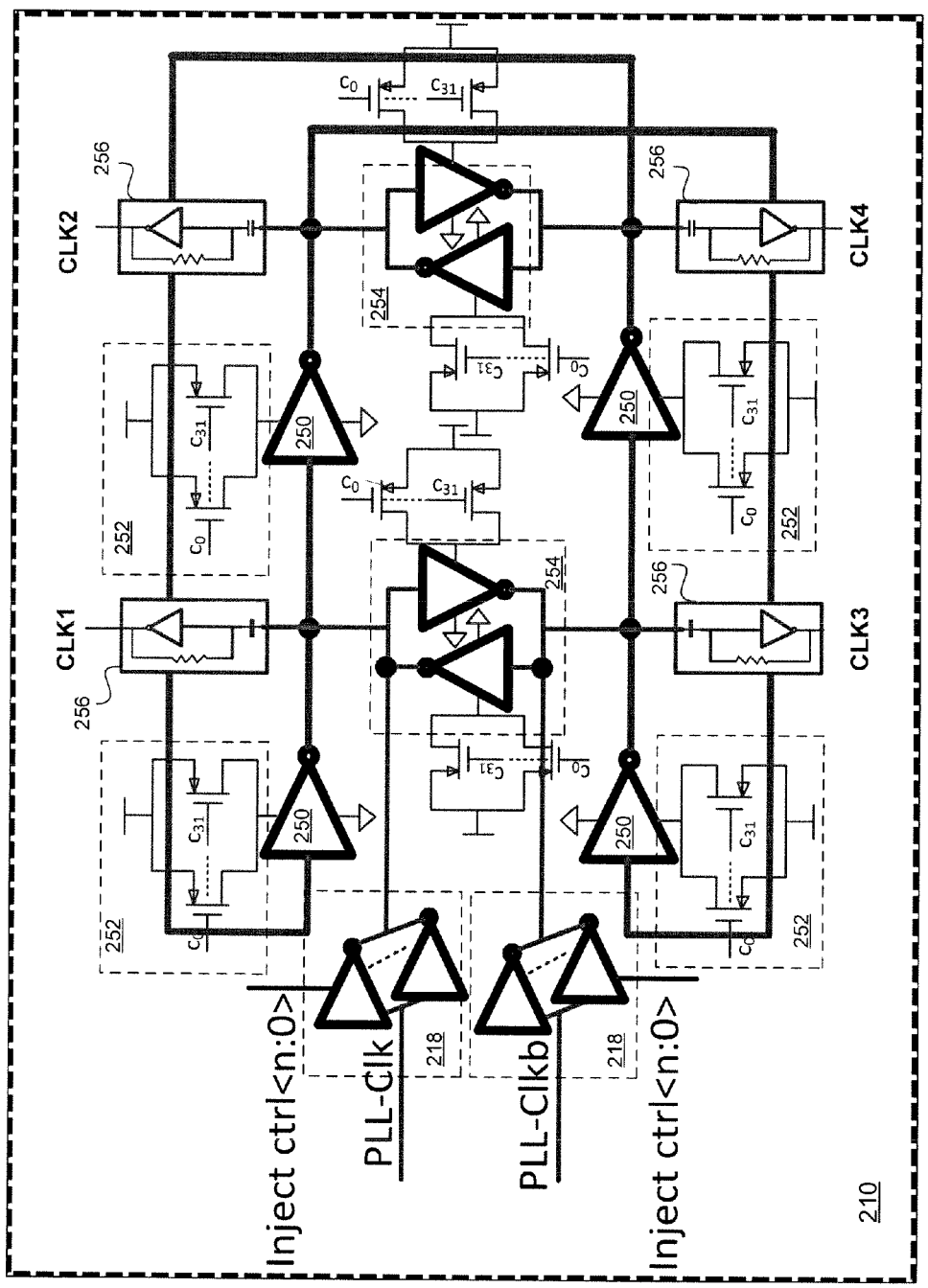

FIGS. 2A-2E illustrate an example of a device 200 for high-speed clock generation and details of the corresponding blocks of the device 200, in accordance with one or more implementations of the subject technology. The device 200 of FIG. 2A is similar to the device 100 of FIG. 1B and includes an ILRO 210 and a PI 220 (e.g., a full rate CMOS PI). The clock signal 202 is generated by the PLL 160 of FIG. 1A and is used by the ILRO 210 to generate multi-phase (e.g., n phase, such as 4, 16, and more) clock signals $\phi_1$-$\phi_n$. The PI 220 may process the multi-phase clock signals and generate the phase-corrected clock signal 204.

At a high level representation, as shown in FIG. 2B, the ILRO 210 may be implemented by a number of current controlled delay cells (e.g., inverters) 250. The ILRO 210 is different from a typical ring oscillator by the fact that the ILRO 210 is a strong injection ring oscillator that is locked by one or more injected clocks (e.g., the PLL clock signal 202). Each inverter 250 may have a current (or voltage) control input 215 that can control the oscillation frequency of the ILRO (e.g., from 10 GHz to 8 or 12 GHz), as the power consumption of each inverter 250 may increase as the oscillation frequency increases. The output 214 of the ILRO 210 may include a number of clock signals with different phase angles (e.g., multi-phase clock signals $\phi_1$-$\phi_n$). The ILRO 210 is a wideband oscillator and may include, for example, two stages for in-phase and quadrature-phase (I/Q) generation and more stages for sub I/Q generations. The ILRO 210 may also include features such as programmable injection strength and tracking bandwidth. As the core of the ILRO 210 is a ring oscillator, it can be implemented (e.g., in CMOS) with minimum area consumption and with minimal impact on noise (e.g., as compared with a large loop delay line loop (DLL)).

In one or more implementations, the PI 220 shown in FIG. 2C may be partitioned into a coarse phase selection module 230 and a fine phase selection module 240, which are described herein with respect to FIG. 2D. The coarse selection module 230, as shown in FIG. 2D, may include a number of front-end selection multiplexers (MUXs) 232 (e.g., CMOS MUXs), grouped at multiple levels to select two or more outputs (e.g., I and Q) from multiple input clock signals (e.g., multi-phase clock signals $\phi_1$-$\phi_n$). The fine selection module 240, as shown in FIG. 2D, may include low-pass filters 242 and 244 and weighting blocks 246 and 248, which may perform smoothing or edge pulling functionalities as described in more detail below.

FIG. 2E shows an example CMOS implementation of a low-power ILRO 210 for a full rate clock and I/Q generation. The ILRO 210 may use inverters 250 to generate full rate 4-phase clock signals. In a typical ring oscillator with basic inverters, an odd number of inverters is needed. In the architecture of FIG. 2E, the delays introduced by blocks 254 may allow the four back-to-back coupled inverter 250 to oscillate. The blocks 252, may provide, for each inverter 250, control signals (e.g., $c_0$-$c_{31}$) that can be used to control the oscillating frequency of the ILRO 210. The input signals (e.g., PLL-Clk and PLL-Clkb) may be received by injection control blocks 218 and injected, through the block 254, to a ring that includes inverters 250. The output signals CLK1, CLK4, CLK3, and CLK2 may be generated with four different phases (e.g., 0°, 90°, 180°, and 270°) and provided through buffer blocks 256.

FIGS. 3A-3C illustrate examples of a smoothing block 316 and a pulling block 320 of a phase interpolator, in accordance with one or more implementations of the subject technology. The diagram shown in FIG. 3A is a prior art digital PI 314, with integral non-linearity (INL) hit in the output signal 315 due to sharp input edges of the I/Q signals 312. Although digital PIs may be advantageous over CML buffers because of area saving, but the sharp edges may impair linearity of the PI, especially at 45° phase interpolation. FIG. 3B shows an example of a digital PI 316 with capacitive slope control used for smoothing the sharp edges. The capacitive slope control may be achieved by adding inverter-capacitor low-pass filters, which can filter input signal harmonics and slow down input edges and result in better linearity. FIG. 3C shows an example of a digital PI 320 with tri-state cross-coupled inverters 325. Adding tri-State cross-coupled inverters 325 may bring quadrature edges close to each other (e.g., pulling), as shown in 322, therefore improving linearity of the output signal 324.

Figure 4B:
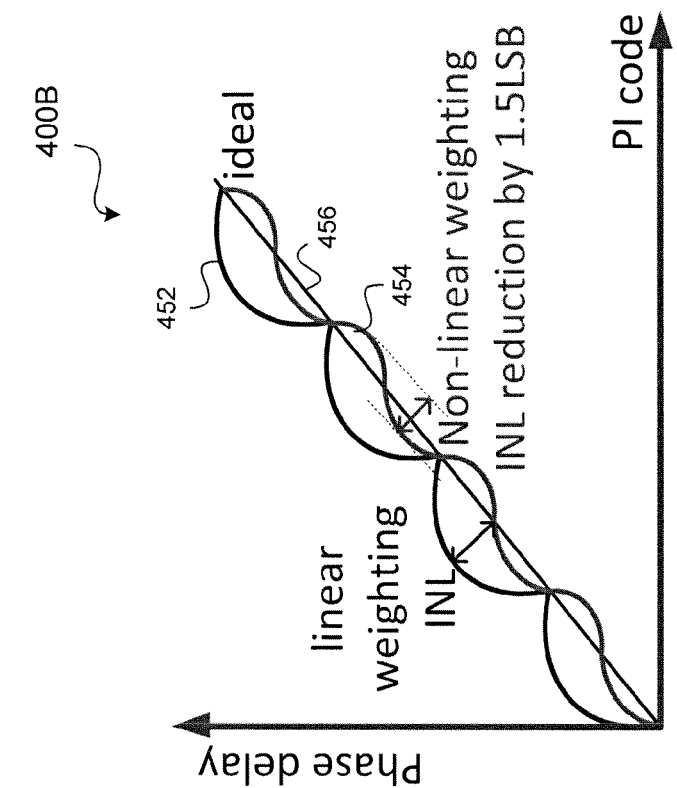
FIGS. 4A-4B illustrate an example 4-phase full-rate in-phase and quadrature-phase (I/Q) generator architecture and a corresponding phase-delay response diagram, in accordance with one or more implementations.
Figure 4A:
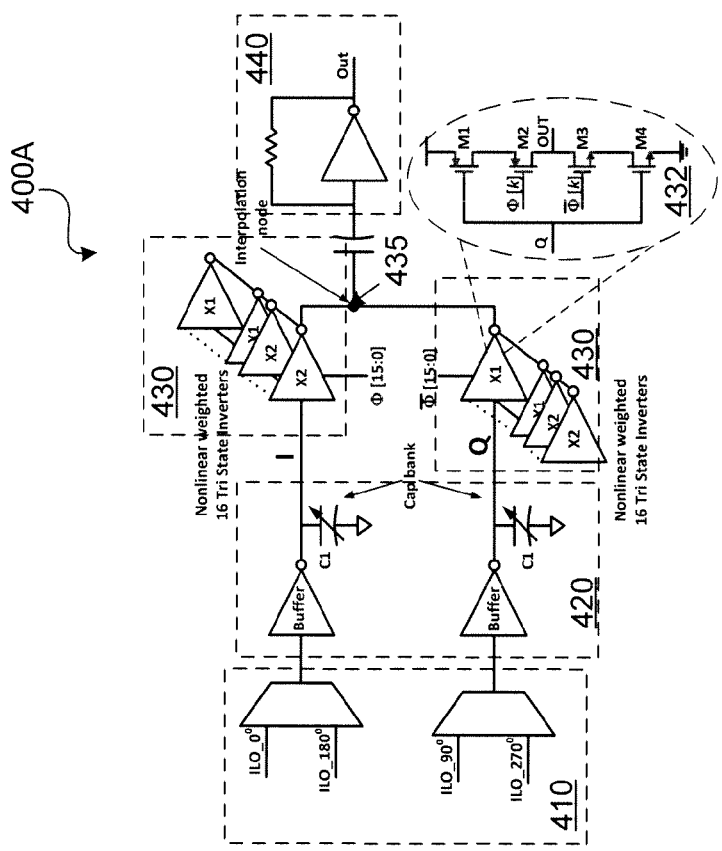

FIGS. 4A-4B illustrate an example 4-phase full-rate I/Q generator architecture 400A and a corresponding phase-delay response diagram 400B, in accordance with one or more implementations of the subject technology. The techniques used in the implementations of FIGS. 3B-3C may be combined in the architecture 400A shown in FIG. 4A, which depicts an example implementation of integral non-linearity correction by nonlinear weighting. A 64-step full-rate PI may use a two-stage ILRO for I/Q generation. The coarse selection block 410 may form the I/Q input signals to the smoothing block 420 from the 4-phase input signals (e.g., at 0°, 180°, 90°, and 270°). Detailed CMOS implementation of each inverter of the blocks 430, as shown in 432, is self-explanatory.

The delay-phase diagram 400B shown in FIG. 4B show the phase delay versus PI-code. The nonlinear weighting performed at blocks 430 can improve integral non-linearity (INL) of the PI by changing a one-sided INL response (e.g., 452) to a sinusoidal INL response (e.g., 454). The sinusoidal INL response 454, due to non-linear weighting INL, is significantly (e.g., by 1.5 LSB) closer to the ideal line (e.g., 456) than the linear weighting INL 452. Initial and final steps of each quadrant may have a large negative differential non-linearity (DNL) due to inverter weak capability for power minimization and significant load at the interpolation point 435.

Figure 5:
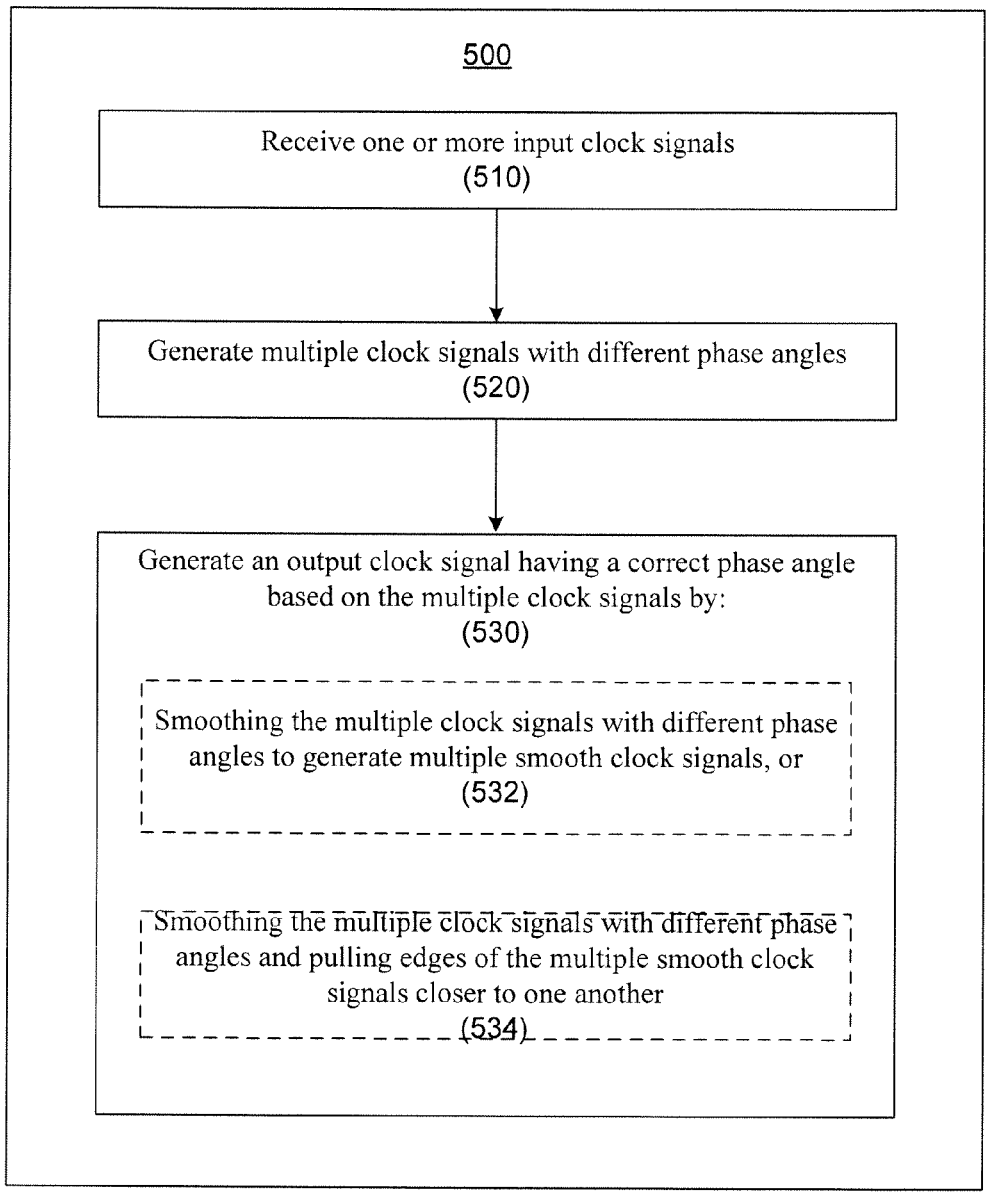
FIG. 5 illustrates an example of a method for high-speed clock generation, in accordance with one or more implementations.

FIG. 5 illustrates an example of a method 500 for high-speed clock generation, in accordance with one or more implementations of the subject technology. The method 500 begins at operation block 510, where one or more input clock signals (e.g., 202 of FIG. 2A) is received at a device (e.g., 110 of FIG. 1B and 200 of FIG. 2A). At operation block 520, multiple clock signals (e.g., clock signals $\Phi_1$-$\Phi_n$ of FIGS. 2A and 2C) with different phase angles may be generated (e.g., by 210 of FIG. 2A). An output clock signal having a correct phase angle (e.g., 204 of FIGS. 2A and 2C) based on the multiple clock signals may be generated (e.g., by 240 of FIGS. 2C and 2D), at operation block 530, by: smoothing, at operation block 532, the plurality of clock signals with different phase angles to generate a plurality of smooth clock signals (e.g., 116 of FIG. 1B and 316 and 318 of FIG. 3B); or by smoothing, at operation block 534, the plurality of clock signals with different phase angles and pulling edges of the plurality of smooth clock signals closer to one another (e.g., 118 of FIG. 1B and 320 and 324 of FIG. 3C).

Those of skill in the art would appreciate that the various illustrative blocks, modules, elements, components, and methods described herein may be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device for high-speed clock generation, the device comprising:
   an injection locking-ring oscillator (ILRO) configured to receive one or more input clock signals and to generate a plurality of clock signals with different phase angles; and
   a phase-interpolator (PI) circuit configured to receive the plurality of clock signals and to generate an output clock signal having a correct phase angle,
   wherein the PI circuit comprises a smoothing block configured to smooth the plurality of clock signals with different phase angles to generate a plurality of smooth clock signals with improved linearity, wherein the smoothing block comprises inverter-based low-pass filters configured to filter harmonics of the plurality of clock signals with different phase angles.

2. The device of claim 1, wherein the device comprises a scalable multi-rate device, and wherein the device comprises a digital device implemented in CMOS.

3. The device of claim 1, wherein the ILRO comprises a compact and low power wide-band ILRO, and wherein the ILRO comprises a strong injection with a current-limited delay line implemented in CMOS.

4. The device of claim 3, wherein the ILRO is configured to reduce an impact on device noise as compared to delay line loop (DLL) implementation with large loop filter, and wherein an injection strength and a tracking bandwidth of the ILRO are programmable.

5. The device of claim 1, wherein the ILRO is configured to receive the one or more input clock signals from a phase-locked loop (PLL), and wherein the ILRO is configured to generate full-rate multi-phase clock signals.

6. The device of claim 5, wherein the full-rate multi-phase clock signals comprises:
   four in-phase (I) and quadrature-phase (Q) clock signals at a full rate, and
   16-phase clock signals at a reduced rate that is one-fourth of a full rate.

7. The device of claim 5, wherein generation of full-rate multi-phase clock signals maintains a same resolution and number of PI-codes and results in a linear power scaling with frequency and an improved linearity response.

8. The device of claim 1, wherein the PI circuit comprises a programmable digital PI.

9. The device of claim 1, further comprising a pulling block comprising tri-state crossed-coupled inverters configured to improve linearity by pulling edges of the plurality of smooth clock signals closer to one another.

10. A method for high-speed clock generation, the method comprising:
    receiving one or more input clock signals;
    generating a plurality of clock signals with different phase angles; and
    generating an output clock signal having a correct phase angle based on the plurality of clock signals by performing smoothing the plurality of clock signals with different phase angles to generate a plurality of smooth clock signals with improved linearity by using inverter-based low-pass filters.

11. The method of claim 10, wherein the high-speed clock generation is performed by using a scalable multi-rate digital device implemented in CMOS.

12. The method of claim 10, wherein receiving the e one or more input clock signals comprises receiving the one or more input clock signals at an injection locking-ring oscillator (ILRO) comprising a compact, low power, strong injection, and wide-band ILRO with a current-limited delay line implemented in CMOS.

13. The method of claim 12, further comprising:
    configuring the ILRO to reduce an impact on device noise as compared to delay line loop (DLL) implementation with large loop filter, and
    programming an injection strength and a tracking bandwidth of the ILRO.

14. The method of claim 12, further comprising configuring the ILRO to:
    receive the one or more input clock signals from a phase-locked loop (PLL); and
    generate the full-rate multi-phase clock signals based on the one or more input clock signals.

15. The method of claim 14, wherein the full-rate multi-phase clock signals comprise
    four in-phase (I) and quadrature-phase (Q) clock signals at a full rate, and
    16-phase clock signals at a reduced rate that is one-fourth of a full rate.

16. The method of claim 14, wherein generating the full-rate multi-phase clock signals comprises maintaining a same resolution and number of PI-codes and maintaining an improved linearity response and a linear power scaling with frequency.

17. The method of claim 10, wherein:
    generating an output clock signal having the correct phase angle comprises using a phase interpolator (PI) comprising a programmable digital PI, and
    the method comprises configuring the inverter-based low-pass filters to filter harmonics of the plurality of clock signals with different phase angles to improve the linearity.

18. The method of claim 10, comprising pulling edges of the plurality of smooth clock signals by using a pulling block comprising tri-state crossed-coupled inverters configured to improve linearity by pulling edges of the plurality of smooth clock signals closer to one another.

19. A high-speed digital system for communication between two endpoints, the system comprising:
    a receive path configured to receive, at a first endpoint, a serial digital signal, to correct a phase of the serial digital signal using a digital device, and to generate a parallel digital signal for processing in a digital signal processor (DSP); and
    a transmit path configured to receive an output of the DSP and to generate a serial digital signal for transmission to a second endpoint;
    wherein the digital device comprises:
    an injection locking-ring oscillator (ILRO) configured to receive one or more input clock signals and to generate a plurality of clock signals with different phase angles; and
    a phase-interpolator (PI) circuit configured to receive the plurality of clock signals and to generate an output clock signal having a correct phase angle, the PI circuit comprising a smoothing block comprising inverter-based low-pass filters configured to filter harmonics of the plurality of clock signals with different phase angles and to smooth the plurality of clock signals with different phase angles to generate a plurality of smooth clock signals with improved linearity.

20. The system of claim 19, wherein:
the ILRO is configured to receive the one or more input clock signals from a phase-locked loop (PLL), and wherein the ILRO is configured to generate hill-rate multi-phase clock signals,
the PI circuit comprises:
  a programmable digital PI, and
  a pulling block comprising a tri-state crossed-coupled inverters configured to improve linearity by pulling edges of the plurality of smooth clock signals closer to one another.

\* \* \* \* \*